United States Patent
Kodaira et al.

[11] Patent Number: 6,137,680
[45] Date of Patent: Oct. 24, 2000

[54] ELECTRONIC COMPONENT COOLING APPARATUS

[75] Inventors: Yuichi Kodaira; Toshiki Ogawara; Nobumasa Kodama, all of Tokyo, Japan

[73] Assignee: Sanyo Denki Co., Ltd., Tokyo, Japan

[21] Appl. No.: 09/190,872

[22] Filed: Nov. 12, 1998

[30] Foreign Application Priority Data

Mar. 31, 1998 [JP] Japan ................................. 10-086491

[51] Int. Cl.⁷ ...................................................... H05K 7/20
[52] U.S. Cl. .......................... 361/697; 361/690; 361/694; 361/695; 257/706; 257/718; 257/719; 257/721; 257/722; 174/15.1; 174/16.1; 174/16.3; 165/80.3; 165/185; 165/104.34; 165/122
[58] Field of Search ..................................... 361/690, 694, 361/695–697, 687, 703; 257/675, 706, 718, 719, 721, 722; 174/16.1; 165/80.3, 121, 122, 124, 125, 126; 454/184; 415/176, 178, 213.1, 214.1

[56] References Cited

U.S. PATENT DOCUMENTS

| | | | |
|---|---|---|---|
| 4,513,812 | 4/1985 | Papst et al. ............................. | 165/80 B |
| 5,251,101 | 10/1993 | Liu ............................................ | 361/717 |
| 5,309,983 | 5/1994 | Bailey ..................................... | 165/80.3 |
| 5,335,722 | 8/1994 | Wu .......................................... | 165/80.3 |
| 5,421,402 | 6/1995 | Lin .......................................... | 165/80.3 |
| 5,452,181 | 9/1995 | Hoover ................................... | 361/697 |
| 5,484,013 | 1/1996 | Morikawa et al. ..................... | 165/80.3 |
| 5,494,098 | 2/1996 | Morosas ................................. | 165/121 |
| 5,495,392 | 2/1996 | Shen ....................................... | 361/697 |
| 5,519,574 | 5/1996 | Kodama et al. ......................... | 361/697 |
| 5,522,700 | 6/1996 | Hong ........................................ | 415/177 |
| 5,615,998 | 4/1997 | Kodama et al. ......................... | 415/177 |
| 5,664,624 | 9/1997 | Tsai et al. ............................... | 165/80.3 |
| 5,701,951 | 12/1997 | Jean ........................................ | 165/121 |
| 5,727,624 | 3/1998 | Ko et al. ................................. | 165/121 |
| 5,835,347 | 11/1998 | Chu ......................................... | 361/697 |
| 5,864,464 | 1/1999 | Lin .......................................... | 361/697 |
| 5,867,365 | 2/1999 | Chiou ...................................... | 361/690 |
| 5,873,406 | 2/1999 | Horng ..................................... | 165/80.3 |
| 5,940,267 | 8/1999 | Katsui et al. ........................... | 361/697 |

FOREIGN PATENT DOCUMENTS

| | | |
|---|---|---|
| 2-23034 | 6/1990 | Japan . |
| 6-268125 | 9/1994 | Japan . |
| 83873 | 3/1996 | Japan . |

*Primary Examiner*—Leo P. Picard
*Assistant Examiner*—Boris L. Chervinsky
*Attorney, Agent, or Firm*—Pearne & Gordon LLP

[57] ABSTRACT

An electronic component cooling apparatus capable of minimizing a reduction in cooling efficiency even when discharge of air heated is restricted to two directions and reducing a manufacturing cost. The cooling apparatus includes a heat sink including an elongated base having a plurality of radiation fins arranged thereon, as well as a fan unit. The fan unit includes a casing in which an impeller provided with a plurality of blades and a motor for revolving the impeller are received. The casing is releasably mounted on the heat sink. The heat sink and the casing of the fan unit cooperate with each other to define two discharge ports and form an air flow space which continuously extends between an end of the radiation fins facing the casing and an opposite wall of the casing.

20 Claims, 3 Drawing Sheets

ELECTRONIC COMPONENT COOLING APPARATUS

BACKGROUND OF THE INVENTION

This invention relates to an electronic component cooling apparatus for cooling an electronic component such as an MPU or the like, and more particularly to an electronic component cooling apparatus of the type that a heat sink on which an electronic component is mounted is forcibly cooled by air fed from a fan unit.

An electronic component cooling apparatus of the type that a heat sink including a plurality of radiation fins and a fan unit are combined with each other has been conventionally known in the art, as disclosed in Japanese Patent Application Laid-Open Publication No. 268125/1994, Japanese Patent Application Laid-Open Publication No. 83873/1996, U.S. Pat. No. 5,519,574, U.S. Pat. No. 5,484,013, U.S. Pat. No. 5,452,181, U.S. Pat. No. 5,421,402, U.S. Pat. No. 5,251,101 and U.S. Pat. No. 5,309,983 and the like.

An electronic component cooling apparatus disclosed in Japanese Patent Application Laid-Open Publication No. 268125/1994 or U.S. Pat. No. 5,309,983 is so constructed that air sucked by a fan unit is forcibly fed to a heat sink. Also, in the electronic component cooling apparatus disclosed, air discharged from blades of the fan unit being rotated about a revolving shaft of a motor is forcibly fed in a radial direction of the revolving shaft rather than an axial direction thereof, to thereby increase cooling efficiency of the electronic component cooling apparatus.

The conventional electronic component cooling apparatus is typically constructed in such a manner that air which is discharged from the fan unit to absorb heat of the radiation fins, resulting in being heated is guided in all directions from a whole circumference of the heat sink. In this respect, an electronic component cooling apparatus disclosed in U.S. Pat. No. 5,309,983 or U.S. Pat. No. 5,519,574 and more specifically FIG. 3A of the patent includes a heat sink having a plurality of radiation fins arranged thereon in a manner to be spaced from each other at intervals while being kept parallel to each other, resulting in air being discharged in two directions in which the radiation fins extend.

Also, U.S. Pat. No. 4,513,812 discloses an electronic component cooling apparatus which is so constructed that an electronic component which generates heat is arranged on a front surface of an elongated base. The base is provided on the front surface thereof with a plurality of radiation fins extending in a longitudinal direction of the base. The cooling apparatus also includes a fan unit which includes a cover member having a wall arranged opposite to the base and is mounted on the base. In the electronic component cooling apparatus thus constructed, air flow forcibly guided from the fan unit toward the base is discharged through two openings provided on both ends of the base defined in a longitudinal direction thereof. Unfortunately, the cooling apparatus disclosed has a disadvantage that the heat sink is significantly increased in size due to arrangement of both electronic component and radiation fins on the base.

Japanese Utility Model Publication No. 23034/1990 discloses an electronic component cooling apparatus including a heat sink which includes a plurality of radiation fins and is arranged on an elongated base and a fan unit which includes a cover member arranged opposite to the base. The radiation fins are arranged so as to permit air fed from the fan unit to be guided in at least one of a width direction of the base perpendicular to a longitudinal direction thereof and an oblique direction between the longitudinal direction and the width direction. Thus, the cooling apparatus permits air to be discharged either in all directions of the elongated base or in a width direction thereof.

U.S. Pat. No. 5,615,998 discloses an electronic component cooling apparatus which is provided with an engagement structure including a plurality of fitting sections provided at a fan unit and a plurality of fitted sections provided at a heat sink and engaged with the fitting sections. The fitting sections and fitted sections are permitted to be engaged with each other by merely approaching the fan unit to the heat sink. Also, the engagement structure of the apparatus includes two engagement members which permit engagement between the fitting sections and the fitted sections to be released when force is applied to ends of the engagement members by two fingers.

An electronic appliance such as a microcomputer or the like in which such an electronic component cooling apparatus is used has been extensively reduced in size, resulting in a space defined around the electronic component cooling apparatus being reduced correspondingly. Thus, when the electronic component cooling apparatus is constructed so as to discharge heated air in all directions from a whole circumference of the heat sink, there occurs a problem that a temperature of other electronic components arranged around the electronic component cooling apparatus is caused to be increased to a level exceeding an allowable level. In particular, the problem is amplified with an increase in length of the heat sink.

The problem has been conventionally solved only by discharging air heated by the heat sink on both sides defined in the longitudinal direction of the heat sink. Unfortunately, such restriction in direction of discharge of the air causes another disadvantage of reducing cooling efficiency of the electronic component cooling apparatus.

SUMMARY OF THE INVENTION

The present invention has been made in view of the foregoing disadvantage of the prior art.

Accordingly, it is an object of the present invention to provide an electronic component cooling apparatus which is capable of substantially preventing or minimizing a reduction in cooling efficiency of the apparatus in spite of discharge of heated air being restricted in two directions.

It is another object of the present invention to provide an electronic component cooling apparatus which is capable of being manufactured at a reduced cost.

It is a further object of the present invention to provide an electronic component cooling apparatus which is capable of substantially preventing or minimizing a reduction in cooling efficiency of the apparatus in spite of use of a heat sink formed by extrusion molding when discharge of heated air is restricted in two directions.

It is still another object of the present invention to provide an electronic component cooling apparatus which is capable of facilitating mounting of accessories or parts thereon.

It is yet another object of the present invention to provide an electronic component cooling apparatus which is capable of significantly decreasing the number of parts for the apparatus and facilitating assembling thereof.

It is a still further object of the present invention to provide an electronic component cooling apparatus which is capable of facilitating coupling between a casing on which a fan unit is mounted and a heat sink and separation of the thus-coupled casing and heat sink from each other.

In accordance with the present invention, an electronic component cooling apparatus is provided which includes a heat sink including an elongated base and a pair of side walls provided integrally with the base. The base has a rear surface mounted thereon with an electronic component to be cooled and a front surface provided thereon with a plurality of radiation fins. The side walls of the heat sink are arranged on both sides of the base defined so as to extend in a longitudinal direction of the base and have the radiation fins interposedly arranged therebetween. When the radiation fins each are formed into a complicated configuration, the heat sink may be made by die casting. However, the die casting causes an increase in cost of the heat sink, leading to an increase in manufacturing cost of the cooling apparatus, thus, it is required to reduce a cost of the heat sink. Arrangement of the radiation fins of the heat sink in such a manner that the radiation fins are substantially parallel to each other in a width direction of the heat sink while being spaced from each other at predetermined intervals and are formed so as to extend in the longitudinal direction of the heat sink while keeping a height thereof unvaried permits the heat sink to be made by extrusion molding, resulting in substantially reducing a cost of the heat sink. Also, use of any ready-made or general-purpose heat sink would likewise reduce a manufacturing cost of the cooling apparatus. Unfortunately, radiation fins of such a cost-reduced heat sink fails to permit a part of the radiation fins to be present at a portion of the heat sink opposite to the impeller and define no space in which a circumference of a portion of an impeller facing the heat sink is received.

Also, the electronic component cooling apparatus includes a fan unit including an impeller provided with a plurality of blades, a motor including a housing and a revolving shaft fixedly mounted thereon with a rotor on which the impeller is mounted and acting to rotate the impeller, a casing provided with a suction opening for receiving the impeller and motor therein, and a plurality of webs for connecting the housing of the motor and the casing to each other so as to position the motor at a central portion of the suction opening. The casing is fixed on the heat sink. In the present. invention, a so-called axial fan which is adapted to suck air from only one side in an axial direction of a revolving shaft of a motor is used. In this respect, the blades of the fan unit used in the present invention is constructed so as to suck air through the suction opening toward the base and discharge air in both an axial direction of said revolving shaft and a radial direction thereof. Such construction permits a part of air discharged from the blades to be struck against the base opposite to the impeller or the radiation fins and then flowed along the base. Thus, a part of air discharged from the blades is permitted to flow in the axial direction of the revolving shaft without being directly struck against the base.

The casing of the fan unit includes an elongated opposite wall arranged opposite to a front surface of the heat sink, a pair of side walls arranged on both sides of the opposite wall defined so as to extend in a longitudinal direction of the opposite wall and extend toward the heat sink, and an annular wall arranged on the opposite wall so as to extend in a direction away from the opposite wall of the casing and having the suction opening defined therein. The casing and heat sink, when both are combined with each other, cooperate together to form two discharge ports on both ends of the base defined in the longitudinal direction thereof and form an air flow space which continuously extends from any one of the discharge ports to the other discharge port between an end of the radiation fins positioned on a side of the casing and the opposite wall of the casing. The blades are positioned at a part thereof facing the heat sink in the air flow space. Thus, the blades are so arranged that a part thereof facing the heat sink is projected through the annular wall of the casing into the air flow space, whereby air discharged from the blades being rotated flows through a circumference of the radiation fins and the air flow space to the discharge ports.

A conventional heat sink reduced in cost which is made by extrusion molding is restricted in a height of radiation fins and a direction thereof. The conventional heat sink causes the radiation fins to be necessarily present at a portion of a front surface of base of the heat sink opposite to an impeller. Also, the conventional heat sink fails to arrange the radiations in such a manner that the radiation fins surround a part of the impeller (particularly, the blades) of the fan unit facing the heat sink. In view of such a fact, the inventors initially attempted to employ a structure wherein an annular wall defining a suction opening therein is increased in height or dimension in an axial direction of a motor, to thereby fully receive the impeller in the annular wall and contact an opposite wall of a casing with an end of the radiation fins of the heat sink facing the casing, resulting in forming a duct between the base of the heat sink and the opposite wall of the casing. Unfortunately, such a structure causes a deterioration in cooling efficiency. It was found that the deterioration in cooling efficiency is mainly due to the fact that air discharged in an axial direction of the impeller from the impeller is struck against the base of the heat sink and then guided through flow passages between the radiation fins to an outlet port, resulting in substantially increasing flow resistance in the flow passages.

In view of the foregoing, the inventors made a variety of tests and as a result, it was found that the above-described construction of the present invention that a gap is formed between the radiation fins of the heat sink and the opposite wall of the casing so as to act as the air flow space, resulting in the blades of the impeller being partially arranged in the air flow space or a part thereof which faces the heat sink being projected through the annular wall of the casing into the air flow space and air is discharged in the radial direction of the revolving shaft of the motor as well as the axial direction thereof from the blades of the fan unit is effective to increase cooling efficiency. Such an increase in cooling efficiency would be for the following reasons. More particularly, the construction would permit a part of air discharged in the radial direction of the revolving shaft of the motor from the blades of the fan unit to be flowed toward the two discharge ports while passing the air flow space reduced in flow resistance, during which the air efficiently cools the radiation fins. Also, it would permit a part of air discharged in the axial direction of the revolving shaft of the motor from the blades and then struck against the base of the heat sink to be guided to the air flow space and then discharged from the discharge ports while passing between the radiation fins. Thus, a reduction in flow resistance of air due to the air flow space and air flow in both axial and radial directions would cooperate together to advantageously increase cooling efficiency of the cooling apparatus.

In the present invention, the heat sink may be integrally formed by extrusion molding. This permits the heat sink to be not only reduced in cost but formed into an elongated shape. This substantially prevents a deterioration in cooling efficiency of the cooling apparatus even when discharge of air is limited to only both sides of the heat sink in the longitudinal direction thereof.

In order to increase the cooling efficiency, it is desired that the base of the heat sink on which the radiation fins are arranged is increased in length to a degree. Unfortunately, such an increase in length leads to an increase in cost of the heat sink. However, a reduction in length of the base causes hot air discharged from the discharge ports to be sucked into the air suction port of the cooling apparatus, leading to a deterioration in cooling efficiency. In order to solve such a problem, the present invention may be so constructed that the casing is provided with a pair of guide extensions for air guide which are arranged so as to extend beyond both ends of the side walls of the heat sink in the longitudinal direction thereof, resulting in air discharged from the discharge ports being further guided toward the ends of the side walls.

In a preferred embodiment of the present invention, the base of the heat sink is integrally provided on both ends thereof in the longitudinal direction thereof with flanges in a manner to extend beyond both ends of the guide extensions in the longitudinal direction thereof. The flanges may be effectively used as a mount means for safely and rigidly mounting any desired parts on the cooling apparatus.

In a preferred embodiment of the present invention, the side walls of the casing each are provided with a plurality of engagement sections in a manner to be spaced from each other at predetermined intervals in the longitudinal direction thereof. The side walls of the heat sink each are provided with a plurality of engaged sections engaged with the engagement sections of the casing. Also, the guide extensions of the casing include opposite wall-side extension sections extending from the opposite wall, as well as a pair of side wall-side extension sections extending from each of the side walls of said casing. The engagement sections and engaged sections are so constructed that engagement therebetween is released by operation of separating the casing from the heat sink while applying force to the side wall-side extension sections in directions in which the side wall-side extension sections approach each other. Such construction simplifies a structure for requiring engagement between the casing of the fan unit and the heat sink and release of the engagement. Also, engagement therebetween does not necessarily require to utilize the guide extension sections.

In a preferred embodiment of the present invention, the side walls of the casing each are integrally provided with two hooks in a manner to be spaced from each other at a predetermined interval in the longitudinal direction thereof. The hooks of each of the side walls of the casing are positioned inside the remaining part of the side wall of the casing so as to be positioned inside the side wall of the heat sink when the heat sink and casing are combined together. The hooks each are so formed that engagement surfaces are provided in a manner to outwardly extend in the width direction. The side walls of the heat sink each are formed on an inner surface thereof with an engaged surface in a manner to continuously extend in the longitudinal direction, wherein the engaged surface is engaged with each of the engagement surfaces. The engagement surfaces of the hooks each constitute each of the engagement sections and the engaged surfaces of the side walls of the heat sink each constitute each of the engaged sections. Such construction minimizes a disadvantage due to restriction in configuration of the engaged sections caused when the seat sink is made by extrusion molding for cost-savings. Also, it facilitates operation of carrying out engagement between the engaged surfaces and the engagement surfaces and release of the engagement.

In a preferred embodiment of the present invention, the side walls of the casing each are integrally provided on an inner surface of a portion thereof positioned between the two hooks with at least one projection in a manner to be projected inwardly therefrom in the width direction, wherein the projection is contacted with an outer surface of each of the side walls of the heat sink corresponding thereto when the heat sink and casing are combined with each other. This minimizes or substantially prevents backlash between the casing and the heat sink which possibly occurs in the width direction.

Also, in a preferred embodiment of the present invention, the side walls of the heat sink each are formed on an outer surface thereof in the width direction with a contact surface in a manner to face outwardly in the width direction and continuously extend in the longitudinal direction. The side walls of the casing each are integrally provided at the portion thereof positioned between the hooks with at least one projection contacted with the contacted surface. Such construction minimizes or substantially prevents backlash between the casing and the heat sink which possibly occurs in a height or vertical direction of the cooling apparatus perpendicular to the longitudinal and width directions.

In a preferred embodiment of the present invention, the hooks of each of the side walls of the casing are positioned adjacently to the side wall-side extension sections, respectively. This facilitates deformation of the hooks.

In a preferred embodiment of the present invention, the side wall-side extension sections of the side walls of the casing include enlargements extending from the opposite wall toward the heat sink, respectively. Application of force to the enlargements increases a moment, to thereby reduce force applied to the side wall-side extension sections. The hooks and the enlargements of the extension sections of the side walls of the casing corresponding thereto may be connected to each other through connections, respectively.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENTS

Figure 1A:
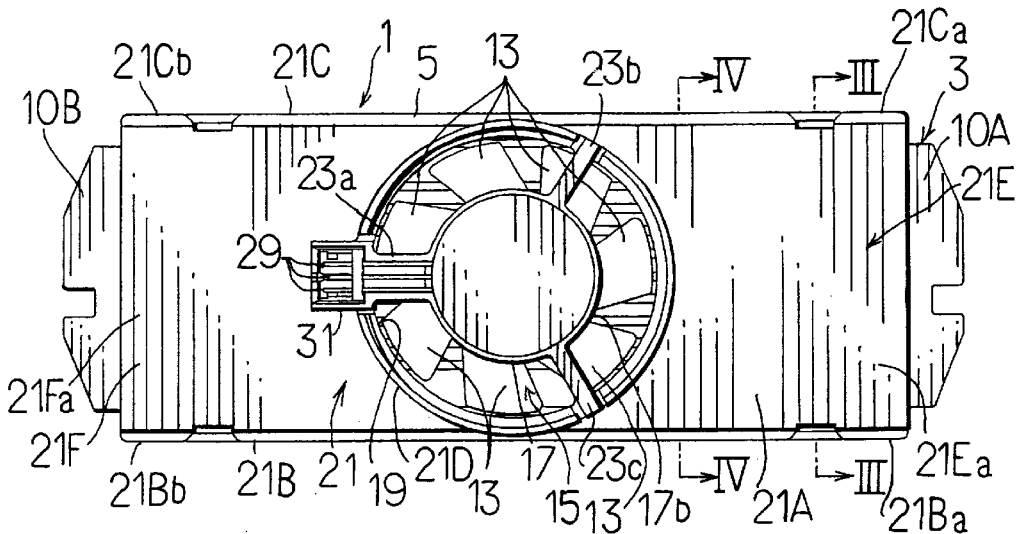
FIG. 1A is a plan view showing an embodiment of an electronic component cooling apparatus according to the present invention.

Now, an electronic component cooling apparatus according to the present invention will be described hereinafter with reference to the accompanying drawings.

Referring to FIGS. 1A to 6, an embodiment of an electronic component cooling apparatus according to the present invention is illustrated. An electronic component cooling apparatus of the illustrated embodiment which is generally designated at reference numeral 1 is adapted to cool an MPU and generally includes a heat sink 3 integrally made of aluminum by extrusion molding and a fan unit 5 mounted on the heat sink 3.

The heat sink 3 includes an elongated base 7 and a pair of side walls 9A and 9B arranged on both sides of the base 7 defined in a longitudinal direction of the base 7 so as to horizontally extend in the longitudinal direction thereof and vertically extend toward the fan unit 5 from the base 7. The base 7 and side walls 9A and 9B are formed in a manner to be integral with each other. The base 7, as shown in FIG. 1C, is provided on a rear surface thereof with an electronic component mounting section 7A on which an electronic component is mounted, as well as a pair of extensions 7B and 7C. The extensions 7B and 7C are arranged on both sides of the electronic component mounting section 7A defined in the longitudinal direction of the base 7 in a manner to be integral with the electronic component mounting section 7A. The electronic component mounting section 7A is formed with four mounting holes 8 in a manner to extend through the base 7 in a thickness direction thereof. An electronic component to be cooled may be mounted on the electronic component mounting section 7A through the mounting holes and a connector. Alternatively, the electronic component may be mounted directly on the electronic component mounting section 7A by means of an adhesive. In the illustrated embodiment, the base 7 is integrally provided on both ends thereof defined in the longitudinal direction thereof with a pair of flanges 10A and 10B.

Figure 3:
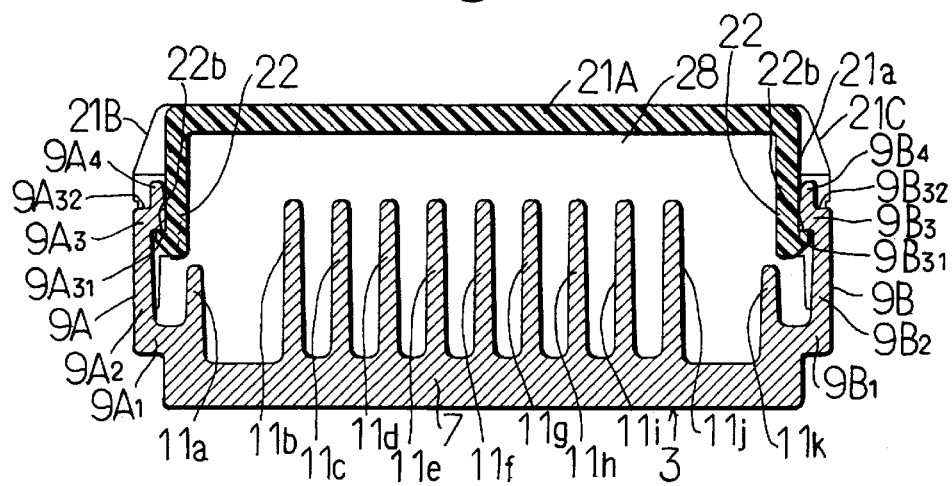
FIG. 3 is a sectional view taken along line III–III of FIG. 1A.
Figure 4:
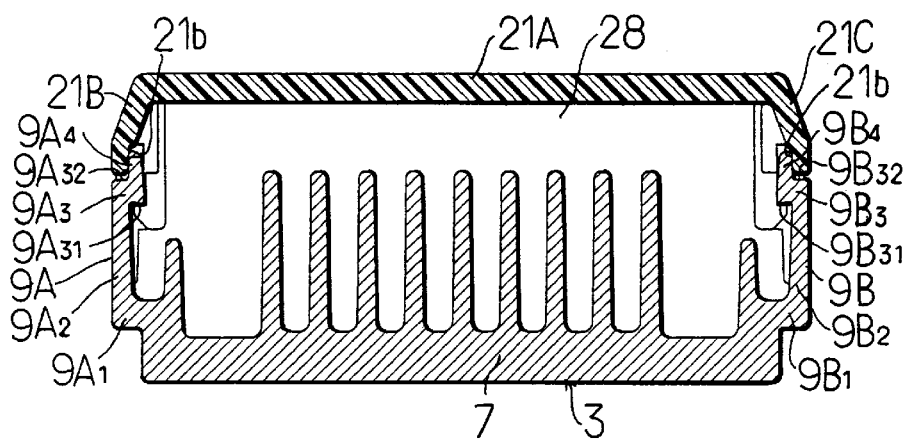
FIG. 4 is a sectional view taken along line IV–IV of FIG. 1B.
Figure 6:
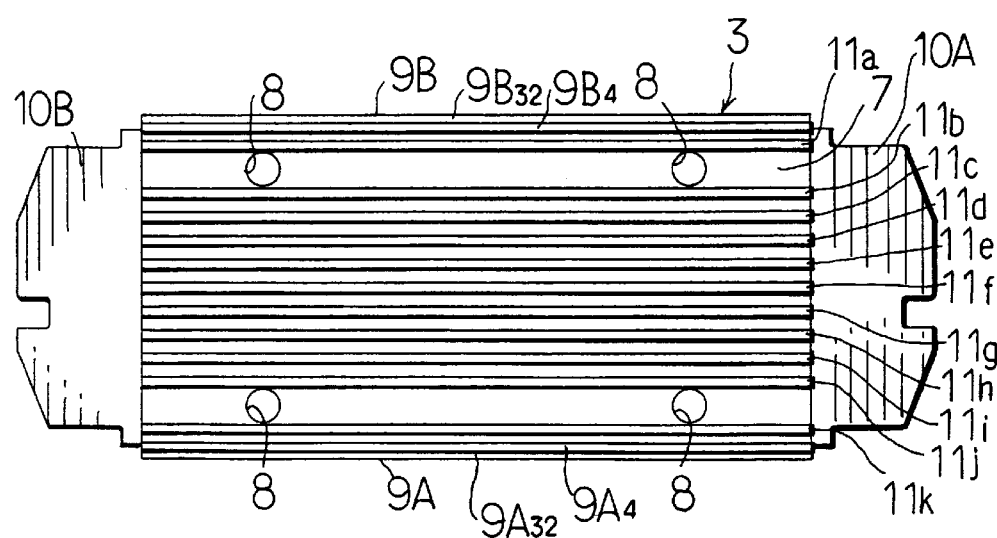
FIG. 6 is a plan view showing a heat sink.

The base 7, as best seen in FIGS. 3, 4 and 6, is integrally provided on a front surface thereof with a plurality of radiation fins 11a to 11k. The radiation fins 11a to 11k each are arranged so as to extend in a longitudinal direction of the base 7. Also, the radiation fins 11a to 11k are arranged so as to be substantially parallel to each other in a lateral or width direction of the base 7 perpendicular to the longitudinal direction thereof while being spaced from each other in the width direction and interposed between the side walls 9A and 9B of the heat sink 3. Further, the radiation fins 11a to 11k each are formed so as to extend in the longitudinal direction of the base 7 while keeping a height thereof substantially unvaried. In addition, the radiation fins 11a to 11k are so constructed that both outermost radiation fins 11a and 11k are formed into a height smaller than that of the remaining radiation fins 11b to 11j and the remaining radiation fins are formed into substantially the same height. As will be noted from FIGS. 3 and 4, the radiation fins 11a to 11k each are so formed that a width thereof is gradually reduced with an increase in vertical distance from the front surface of the base 7.

The side walls 9A and 9B of the heat sink 3, as shown in FIGS. 3 and 4, include base sections 9A1 and 9B1 formed on both sides of the base 7 defined in the lateral or width direction of the base 7 so as to outwardly extend therefrom, wall body sections 9A2 and 9B2 formed on an outer end of the base sections 9A1 and 9B1 so as to upwardly extend therefrom, horizontal sections 9A3 and 9B3 formed on a distal or upper end of the wall body sections 9A2 and 9B2 so as to inwardly horizontally extend therefrom, and fit end sections 9A4 and 9B4 formed on an inner end of the horizontal sections 9A3 and 9B3 so as to upwardly extend therefrom, respectively. The side walls 9A and 9B are arranged so as to extend in the longitudinal direction of the base 7. The horizontal sections 9A3 and 9B3 have inner surfaces arranged so as to face the base 7, respectively, which constitute engaged surfaces 9A31 and 9B31 engaged with engagement surfaces 22b of hooks 22 provided on side walls 21B and 21C of a casing 21 described hereinafter, respectively. The horizontal section 9A3 and 9B3 have outer surfaces positioned on a side thereof opposite to the engaged surfaces 9A31 and 9B31, respectively, which constitute contact surfaces 9A32 and 9B32 with which two projections 21b provided on the side walls 21B and 21C of the casing 21 are contacted, respectively. The engaged surfaces 9A31 and 9B31 are formed so as to continuously extend in a longitudinal direction of the side walls 9A and 9B and likewise the contact surfaces 9A32 and 9B32 are arranged so as to continuously extend in the longitudinal direction.

The fan unit 5, as shown in FIG. 1A, includes an impeller 15 including seven blades 13, a motor 17 having a revolving shaft 17a (FIG. 5B) fixedly mounted thereon with the impeller 15 and actuated so as to rotate the impeller 15, the casing 21 formed with a suction opening 19 in which an upper half of the impeller 15 and the motor 17 are received therein, and three webs 23a to 23b for connecting a housing 17b of the motor 17 to the casing 21 to position the motor 17 at a central portion of the suction opening 19. In the illustrated embodiment, the casing 21, the housing 17b of the motor 17 and three such webs 23a to 23c are integrally formed of a molding material mainly consisting of a synthetic resin material. The motor 17 may include an internal structure which may be constructed in such a manner as disclosed in Japanese Patent Application Laid-Open Publication No. 83873/1996.

Figure 5A:
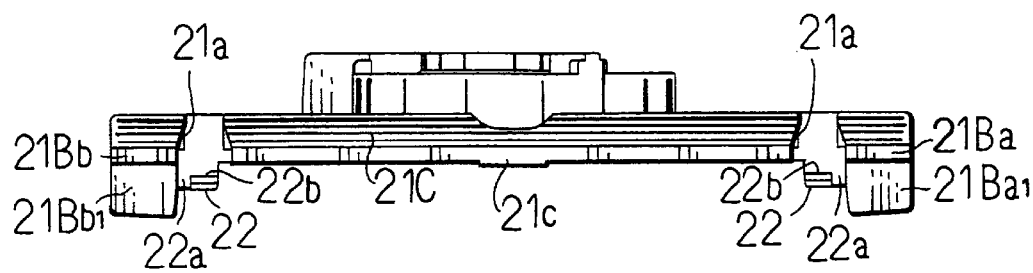
FIG. 5A is a front elevation view showing a fan unit.
Figure 5B:
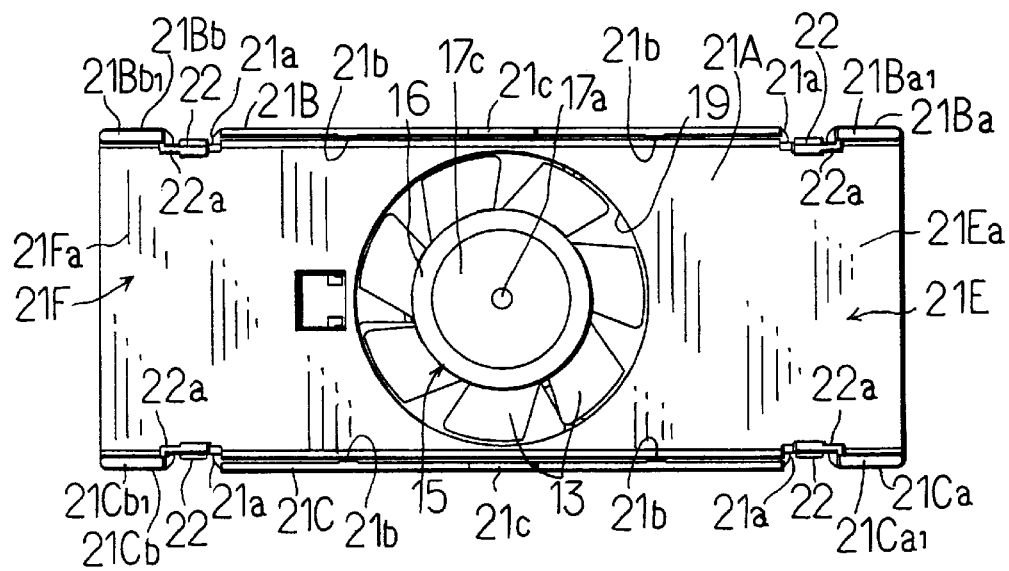
FIG. 5B is a bottom view of the fan unit shown in FIG. 5A.

The impeller 15, as shown in FIG. 5B, includes an annular member 16 fitted on an outer periphery of a rotor 17c of the motor 17 and seven such blades 13 arranged on an outer periphery of the annular member 16 in a manner to be spaced from each other at predetermined intervals in a peripheral direction of the annular member 16. The blades 13 are constructed so as to permit air sucked from the suction opening 19 toward the base 7 in an axial direction of the revolving shaft 17a to be positively discharged in a radial direction of the revolving shaft 17a. It is of course that the fan unit 5 is constituted by an axial fan, to thereby permit a part of air sucked to flow in the axial direction or toward the base 7.

Figure 1B:
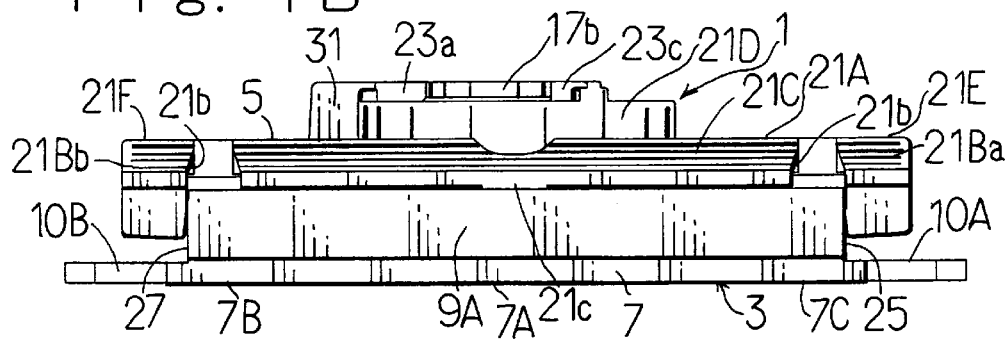
FIG. 1B is a front elevation view of the electronic component cooling apparatus shown in FIG. 1A.
Figure 1C:
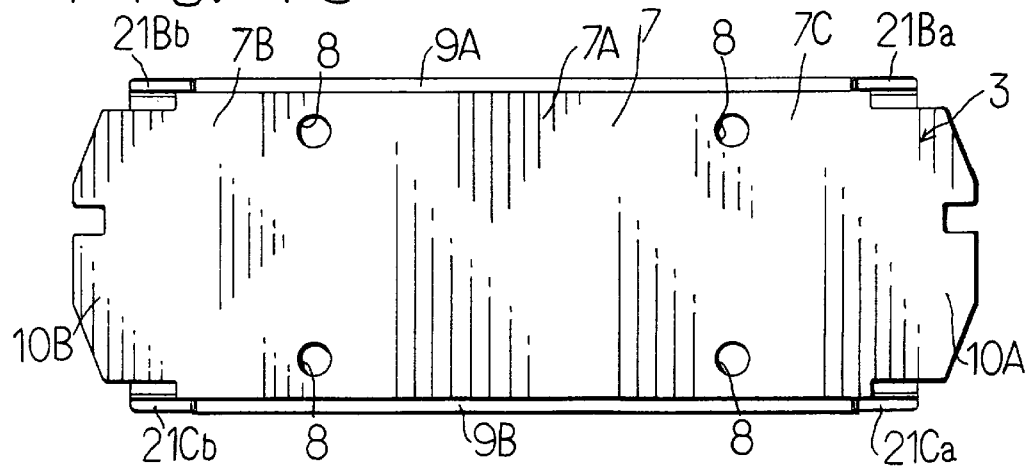
FIG. 1C is a bottom view of the electronic component cooling apparatus shown in FIG. 1B.
Figure 2A:
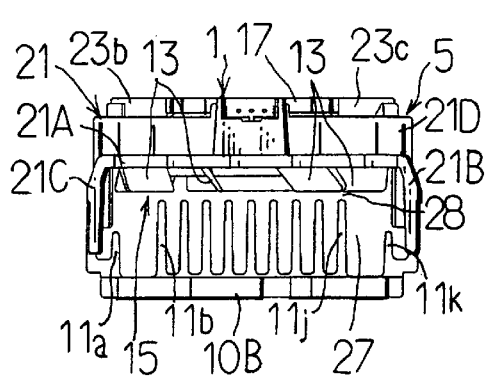
FIG. 2A is a right-side elevation view of the electronic component cooling apparatus shown in FIG. 1A.
Figure 2B:
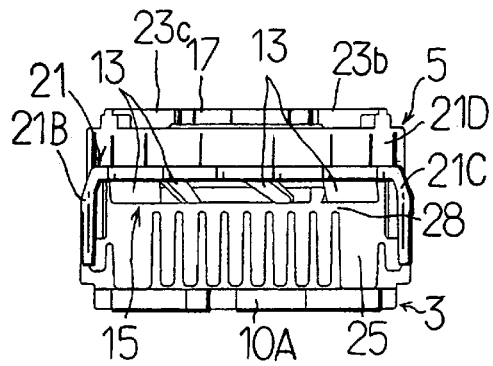
FIG. 2B is a left-side elevation view of the electronic component cooling apparatus shown in FIG. 1A.

The casing 21 includes an opposite wall 21A arranged opposite to a front surface of the heat. sink 3 and a pair of the side walls 21B and 21C arranged on both sides of the opposite wall 21A defined in a longitudinal direction of the wall 21A so as to extend in the longitudinal direction and downwardly extend toward the heat sink 3, and an annular wall 21D arranged on the opposite wall 21A so as to extend in a direction away from the opposite wall 21A and having the suction opening 19 defined therein. The side walls 21B and 21C of the casing 21 and the side walls 9A and 9B of the heat sink 3, as shown in FIG. 1B and FIGS. 2A and 2B, cooperate with each other to form two discharge ports 25 and 27 on both ends of the electronic component cooling apparatus 1 defined in a longitudinal direction thereof, respectively, when the casing 21 and heat sink 3 are combined with each other. This results in an air flow space 28 which continuously extends from any one of the discharge ports 25 and 27 to the other discharge port being formed between an end of the radiation fins 11a to 11k positioned on a side of the casing 21 and the opposite wall 21A of the casing 21, as shown in FIGS. 2A and 2B and FIGS. 4A and 4B. A height of the air flow space 28 is determined by suitably selecting a height of the side walls 21B and 21C of the casing 21 and a height of the side walls 9a and 9B of the heat sink 3.

The blades 13 of the impeller 15, as clearly shown in FIGS. 2A and 2B, are arranged in a manner to be positioned at a lower half thereof facing the heat sink 3 in the air flow space 28. In other words, the blades 13 of the impeller 15 are so arranged that a part thereof positioned on a side of the heat sink 3 is projected through the annular wall 21D into the air flow space 28. This results in air discharged from the blades 13 which are being rotated being guided through a circumference of the radiation fins 11a to 11k and the air flow space 28 to the discharge ports 25 and 27. Such construction would permit air discharged in the radial direction of the revolving shaft 17a of the motor 17 from the blades 13 of the fan unit 5 to partially flow toward the discharge ports 25 and 27 while passing the air flow space 28 reduced in resistance, during which the air effectively cools the radiation fins 11a to 11k. Also, air discharged in the axial direction of the revolving shaft 17a of the motor 17 from the blades 13 of the fan unit 5, resulting in striking on the base 7 of the heat sink 3 would be partially guided to the air flow space 28 while passing a plurality of flow passages between the radiation fins 11a to 11k and discharged through the discharge ports 25 and 27. Thus, a reduction in flow resistance due to the air flow space 28 and two kinds of air flow described above synergetically cooperate with each other to increase cooling efficiency. In this regard, an experiment by the inventors indicated that the electronic component cooling apparatus of the illustrated embodiment is increased in cooling efficiency by 4% to 8% as compared with an electronic component cooling apparatus free of the air flow space 28 which is so constructed that the opposite wall 21A of the casing 21 is contacted with a distal end of the radiation fins 11b to 11j of the heat sink 3 and the impeller 15 is fully received in the annular wall 21D of the casing 21.

The casing 21 includes a pair of guide extensions 21E and 21F for air guide which are arranged so as to extend beyond the two discharge ports 25 and 27 to both ends of the base 7 defined in the longitudinal direction thereof. The guide extensions 21E and 21F act to permit air discharged from the discharge ports 25 and 27 to be guided in directions contrary to each other or toward both sides of the casing 21 define din the longitudinal direction thereof. The guide extensions 21E and 21F include opposite wall-side extension sections 21E*a* and 21F*a* extending from the opposite wall 21A, as well as a pair of first side wall-side extension sections 21B*a* and 21B*b* extending from the side wall 21B of the casing 21 and a pair of second side wall-side extension sections 2C*a* and 21C*b* extending from the side wall 21C, respectively. The guide extensions 21E and 21F each are formed into a length which prevents air discharged from the guide extensions 21E and 21F from being sucked directly into the suction opening 19.

Arrangement of the guide extensions 21E and 21F on the casing 21 restrains air heated by the heat sink 3 and discharged from the discharge ports 25 and 27 from being sucked directly into the suction opening 19. This results in the electronic component cooling apparatus 1 of the illustrated embodiment exhibiting heat dissipation with increased efficiency. In the illustrated embodiment, the opposite wall 21A and side walls 21B and 21C of the casing 21 are arranged so as to extend beyond the extension 7B and 7C of the base 7 of the heat sink 3 or both ends of the side walls 9A and 9B of the heat sink 3 defined in the longitudinal direction thereof, to thereby constitute the guide extensions 21E and 21F. The side extension sections 21B*a* and 21B*b* of the guide extension 21E and the side extension sections 21C*a* and 21C*b* of the guide extension 21F each are formed into a height which permits each side extension section to extend to a level in proximity to the front surface of the flanges 10*a* and 10B of the heat sink 3. This results in the first side wall-side extension sections 21B*a* and 21B*b* and second side wall-side extension sections 21C*a* and 21C*b* of the casing including enlargements 21B*a*1, 21B*b*1 and 21C*a*1, 21C*b*1 which extend from the opposite wall 21A toward the heat sink 3, respectively.

The side walls 21B and 21C of the casing 21, as shown in FIG. 3 and FIGS. 5A and 5B, each are integrally provided with the above-described two hooks 22 in a manner to be spaced from each other in the longitudinal direction thereof. The hooks 22 each act as an engagement. The hooks 22 are arranged so as to extend from the side walls 21B and 21C of the casing 21 toward the heat sink 3 and connected through connections 22*a* to the enlargements 21B*a*1 and 21B*b*1 and enlargements 21C*a*1 and 21C*b*1 of the first side wall-side extension sections 21B*a* and 21B*b* and second side wall-side extension sections 21C*a* and 21C*b*, respectively. The hooks 22 of the side walls 21B and 21C of the casing 21 are arranged so as to be positioned inside the remaining part of the side walls 21B and 21C, resulting in being positioned inside the side walls 9A and 9B of the heat sink 3, when the casing 21 is combined with the heat sink 3. Such arrangement permits the side walls 21B and 21C of the casing 21 to be formed at a portion thereof corresponding to the hooks 22 with recesses 21*a*. The hooks 22, as shown in FIG. 3, each are so formed that the engagement surface 22*b* is projected in the width direction of the casing 21. This permits the engagement surface 22*b* of each of the hooks 22 to be engaged with each of the engaged surfaces 9A31 and 9B31 of the side walls 9A and 9B of the heat sink 3, resulting in the casing 21 being detachably mounted on the heat sink 3.

Also, the illustrated embodiment is constructed so as to minimize backlash at an engagement between the casing 21 of the fan unit 5 and the heat sink 3 in the above-described detachable engagement structure. More particularly, the side walls 21B and 21C of the casing 21 each are provided on a portion of an inner surface thereof positioned between the two hooks 22 with two inwardly extending projections 21*b*, each of which is arranged so as to be contacted with an outer surface of each of the side walls 9A and 9B of the heat sink 3 (or an outer surface of each of the fit end sections 9A4 and 9B4 thereof) corresponding thereto when the heat sink 3 and casing 21 are combined together. Such arrangement of the projections 21*b* permits a direction of force applied from the hooks 22 to the side walls 9A and 9B of the heat sink 3 corresponding thereto to be opposite to that of force applied from the projections 21*b* to the side walls 9A and 9B of the heat sink 3 corresponding thereto. This results in the fit end sections 9A4 and 9B4 being interposed between the hooks 22 and the projections 21*b*, to thereby minimize backlash possibly occurring in the width direction between the casing 21 and the heat sink 3. In the illustrated embodiment, the side walls 21B and 21C of the casing 21 each are provided thereon with two such projections 21*b*. Alternatively, one such projection or three or more such projections may be provided.

Also, in the illustrated embodiment, the side walls 21B and 21C of the casing 21 each are integrally provided on a portion thereof positioned between the two hooks 22 with a single projection 21*c*, which is contacted with each of the contact surfaces 9A32 and 9B32 provided on the side walls 9A and 9B of the heat sink 3. The projection 21*c* is arranged so as to be projected from an end of each of the side walls 21B and 21C of the casing 21 opposite to the heat sink 3 toward the heat sink 3. Such arrangement, when the casing 21 and heat sink 3 are combined together, permits the engagement surfaces 22b of the hooks 22 to be engaged with the engaged surface 9A31 and 9B31 of the side walls 9a and 9B of the heat sink 3 on the inside of the side walls 9a and 9B of the heat sink 3 and each of the contact surfaces 9A32 and 9B32 of the side walls 9a and 9B of the heat sink 3 to be engaged or contacted with the projection 21c of each of the side walls 21B and 21C of the casing 21 on the outside of the side walls 9a and 9B of the heat sink 3. This results in minimizing backlash possibly occurring in a vertical direction between the casing 21 and the heat sink 3. In the illustrated embodiment, the single projection 21c is arranged between the two projections 21b or at the central position. However, the number of projections 21c and a position thereof may be selected as desired.

Now, mounting of the casing 21 on the heat sink 3 by manual operation will be described.

First, the enlargements 21Ba1 and 21Ca1 of the first and second side wall-side extension sections 21Ba and 21Ca of one guide extension 21E are interposedly held by the thumb and index finger of one hand of an operator and the enlargements 21Bb1 and 21Cb1 of the first and second side wall-side extension sections 21Bb and 21Cb of the other guide extension 21F are interposedly held by the thumb and index finger of the other hand of the operator. Then, force is applied to the side wall-side extension sections to approach the first and second side wall-side extension sections 21Ba and 21Ca to each other and approach the first and second side wall-side extension sections 21Bb and 21Cb to each other. Then, the casing 21 is approached to the heat sink 3 to position the hooks 22 of the casing 21 inside the side walls 9B and 9B of the heat sink 3. Then, application of force to the side wall-side extension sections is released. Such operation permits the engagement surfaces 22b of the hooks 22 of the casing 21 to be engaged with the engaged surfaces 9A31 and 9B31 of the heat sink 3. Release of the engagement may be attained by applying force to the side wall-side extension sections to approach the first and second side wall-side extension sections 21Ba and 21Ca to each other and approach the second side wall-side extension sections 21Bb and 21Cb to each other. Concurrently, the casing 21 is separated from the heat sink 3, resulting in the engagement surfaces 22b of the hooks 22 of the casing 21 being released from engagement with the engaged surfaces 9A31 and 9B31 of the heat sink 3.

In the illustrated embodiment, as shown in FIG. 1A, of the webs 23a to 23c, the web 23b has three connection conductors 29 received therein, which are electrically connected to a circuit arranged in the motor. Also, the annular wall 21D is integrally formed with an expansion 31 for formation of a connector. The connection conductors 29 are positioned at an outer end thereof in a recess formed at an upper end of the expansion 31.

In the illustrated embodiment, the heat sink 3 is formed by extrusion molding. However, the heat sink 3 may be formed by any suitable techniques other than extrusion molding. Also, the number of the radiation fins of the heat sink and a position thereof may be suitably selected. The heat sink to which the present invention may be applied merely requires that the radiation fins are partially arranged opposite to the impeller and a space in which a portion of the impeller facing the heat sink is received is not provided. Thus, the present invention may be applied to a heat sink which is so constructed that a plurality of radiation fins rectangular in section and having the same height are vertically arranged on a whole surface of a base.

As can be seen form the foregoing, the electronic component cooling apparatus of the present invention includes the heat sink reduced in manufacturing cost which may be formed by, for example, extrusion molding. Also, the present invention minimizes reduction in cooling efficiency in spite of the construction that discharge of air is restricted to both sides in the longitudinal direction of the heat sink.

While a preferred embodiment of the invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. An electronic component cooling apparatus comprising:

a heat sink including an elongated base and a pair of side walls provided integrally with said base;

said base having a rear surface mounted thereon with an electronic component to be cooled and a front surface provided thereon with a plurality of radiation fins;

said side walls being arranged on both sides of said base defined so as to extend in a longitudinal direction of said base and having said radiation fins interposedly arranged therebetween;

a fan unit including an impeller provided with a plurality of blades, a motor including a housing and a revolving shaft fixedly mounted thereon with a rotor on which said impeller is mounted and acting to rotate said impeller, a casing provided with a suction opening for receiving said impeller and motor therein, and a plurality of webs for connecting said housing of said motor and said casing to each other so as to position said motor at a central portion of said suction opening, said casing being fixed on said heat sink;

said blades of said fan unit being constructed so as to suck air through said suction opening toward said base and discharge air in both an axial direction of said revolving shaft and a radial direction thereof;

said casing including an elongated opposite wall arranged opposite to the front surface of said heat sink and a pair of side walls arranged on both sides of said opposite wall defined so as to extend in a longitudinal direction of said opposite wall and extend toward said heat sink, and an annular wall arranged on said opposite wall so as to extend in a direction away from said opposite wall of said casing and having said suction opening defined therein;

said radiation fins of said heat sink being arranged so as to permit a part of said radiation fins to be present at a portion of said heat sink opposite to said impeller and so as not to define a space in which a circumference of a portion of said impeller facing said heat sink is received;

said casing and heat sink, when both are combined with each other, cooperating with each other to form two discharge ports on both ends of said base defined in said longitudinal direction thereof and form an air flow space which continuously extends from any one of said discharge ports to the other discharge port between an end of said radiation fins positioned on a side of said casing and said opposite wall of said casing;

said blades being positioned at a part thereof facing said heat sink in said air flow space.

2. An electronic component cooling apparatus as defined in claim 1, wherein said casing is provided with a pair of guide extensions for air guide which are arranged so as to extend beyond both ends of said side walls of said heat sink in the longitudinal direction thereof, resulting in air discharged from said discharge ports being further guided toward said ends of said side walls.

3. An electronic component cooling apparatus as defined in claim 2, wherein said base of said heat sink is integrally provided on both ends thereof in said longitudinal direction thereof with flanges in a manner to extend beyond both ends of said guide extensions in said longitudinal direction thereof.

4. An electronic component cooling apparatus as defined in claim 2, wherein said side walls of said casing each are provided with a plurality of engagement sections in a manner to be spaced from each other at predetermined intervals in the longitudinal direction thereof;

said side walls of said heat sink each are provided with a plurality of engaged sections engaged with said engagement sections of said casing; and said guide extensions of said casing include opposite wall-side extension sections extending from said opposite wall, as well as a pair of side wall-side extension sections extending from each of said side walls of said casing;

said engagement sections and engaged sections being so constructed that engagement therebetween is released by operation of separating said casing from said heat sink while applying force to said side wall-side extension sections in directions in which said side wall-side extension sections approach each other.

5. An electronic component cooling apparatus as defined in claim 4, wherein said side walls of said casing each are integrally provided with two hooks in a manner to be spaced from each other at a predetermined interval in the longitudinal direction thereof;

said hooks of each of said side walls of said casing being positioned inside the remaining part of said side wall of said casing so as to be positioned inside said side wall of said heat sink when said heat sink and casing are combined together;

said hooks each being so formed that engagement surfaces are provided in a manner to outwardly extend in a width direction of said opposite wall perpendicular to said longitudinal direction thereof; and said side walls of said heat sink each are formed on an inner surface thereof with an engaged surface in a manner to continuously extend in said longitudinal direction, said engaged surface being engaged with each of said engagement surfaces;

said engagement surfaces of said hooks each constituting each of said engagement sections;

said engaged surfaces of said side walls of said heat sink each constituting each of said engaged sections.

6. An electronic component cooling apparatus as defined in claim 5, wherein said side walls of said casing each are integrally provided on an inner surface of a portion thereof positioned between said two hooks with at least one projection in a manner to be projected inwardly therefrom in said width direction;

said projection being contacted with an outer surface of each of said side walls of said heat sink corresponding thereto when said heat sink and casing are combined with each other.

7. An electronic component cooling apparatus as defined in claim 6, wherein said side walls of said heat sink each are formed on an outer surface thereof in said width direction with a contact surface in a manner to face outwardly in said width direction and continuously extend in said longitudinal direction; and, said side walls of said casing each are provided at said portion thereof positioned between said hooks with at least one projection contacted with said contacted surface.

8. An electronic component cooling apparatus as defined in claim 5, wherein said side walls of said heat sink each are formed on an outer surface thereof in said width direction with a contact surface in a manner to face outwardly in said width direction and continuously extend in said longitudinal direction;

said side walls of said casing each are integrally provided on an inner surface of a portion thereof positioned between said two hooks with at least one projection in a manner to be projected inwardly therefrom in said width direction; and said side walls of said casing each are integrally provided at a portion thereof positioned between said projections with at least one projection contacted with said contacted surface.

9. An electronic component cooling apparatus as defined in claim 5, wherein said hooks of each of said side walls of said casing are positioned adjacently to said side wall-side extension sections, respectively.

10. An electronic component cooling apparatus as defined in claim 5, wherein said side wall-side extension sections of said side walls of said casing include enlargements extending from said opposite wall toward said heat sink, respectively;

said hooks and said enlargements of said extension sections of said side walls of said casing corresponding thereto being connected to each other through connections, respectively.

11. An electronic component cooling apparatus comprising:

a heat sink including an elongated base and a pair of side walls provided integrally with said base;

said base having a rear surface mounted thereon with an electronic component to be cooled and a front surface provided thereon with a plurality of radiation fins;

said side walls being arranged on both sides of said base defined so as to extend in a longitudinal direction of said base and having said radiation fins interposedly arranged therebetween;

a fan unit including an impeller provided with a plurality of blades, a motor including a housing and a revolving shaft fixedly mounted thereon with a rotor on which said impeller is mounted and acting to rotate said impeller, a casing provided with a suction opening for receiving said impeller and motor therein, and a plurality of webs for connecting said housing of said motor and said casing to each other so as to position said motor at a central portion of said suction opening, said casing being fixed on said heat sink;

said casing, said housing of said motor and said webs being integrally formed of a molding material mainly consisting of synthetic resin;

said radiation fins of said heat sink being arranged so as to be substantially parallel to each other in a width direction of said heat sink while being spaced from each other at predetermined intervals and formed so as to extend in the longitudinal direction of said heat sink while keeping a height thereof unvaried;

said blades of said fan unit being constructed so as to suck air through said suction opening toward said base and discharge air in both an axial direction of said revolving shaft and a radial direction thereof;

said casing including an elongated opposite wall arranged opposite to the front surface of said heat sink and a pair of side walls arranged on both sides of said opposite wall defined so as to extend in a longitudinal direction of said opposite wall and extend toward said heat sink, and an annular wall arranged on said opposite wall so as to extend in a direction away from said opposite wall of said casing and having said suction opening defined therein;

said casing and heat sink, when both are combined with each other, cooperating with each other to form two discharge ports on both ends of said base defined in said longitudinal direction thereof while being surrounded with said base of said heat sink, said side walls of said heat sink and said opposite wall of said casing and form an air flow space which continuously extends from any one of said discharge ports to the other discharge port between an end of said radiation fins positioned on a side of said casing and said opposite wall of said casing;

said blades being so arranged that a part thereof facing said heat sink is projected through said annular wall of said casing into said air flow space;

whereby air discharged from said blades being rotated flows through a circumference of said radiation fins and said air flow space to said discharge ports.

12. An electronic component cooling apparatus as defined in claim 11, wherein said casing is provided with a pair of guide extensions for air guide which are arranged so as to extend beyond both ends of said side walls of said heat sink in the longitudinal direction thereof, resulting in air discharged from said discharge ports being further guided toward said ends of said side walls.

13. An electronic component cooling apparatus as defined in claim 12, wherein said base of said heat sink is integrally provided on both ends thereof in said longitudinal direction thereof with flanges in a manner to extend beyond both ends of said guide extensions in said longitudinal direction thereof.

14. An electronic component cooling apparatus as defined in claim 13, wherein said side walls of said casing each are provided with a plurality of engagement sections in a manner to be spaced from each other at predetermined intervals in the longitudinal direction thereof;

said side walls of said heat sink each are provided with a plurality of engaged sections engaged with said engagement sections of said casing; and said guide extensions of said casing include opposite wall-side extension sections extending from said opposite wall, as well as a pair of side wall-side extension sections extending from each of said side walls of said casing;

said engagement sections and engaged sections being so constructed that engagement therebetween is released by operation of separating said casing from said heat sink while applying force to said side wall-side extension sections in directions in which said side wall-side extension sections approach each other.

15. An electronic component cooling apparatus as defined in claim 14, wherein said side walls of said casing each are integrally provided with two hooks in a manner to be spaced from each other at a predetermined interval in the longitudinal direction thereof;

said hooks of each of said side walls of said casing being positioned inside the remaining part of said side wall of said casing so as to be positioned inside said side wall of said heat sink when said heat sink and casing are combined together;

said hooks each being so formed that engagement surfaces are provided in a manner to outwardly extend in a width direction of said opposite wall perpendicular to said longitudinal direction thereof; and said side walls of said heat sink each are formed on an inner surface thereof with an engaged surface in a manner to continuously extend in said longitudinal direction, said engaged surface being engaged with each of said engagement surfaces;

said engagement surfaces of said hooks each constituting each of said engagement sections;

said engaged surfaces of said side walls of said heat sink each constituting each of said engaged sections.

16. An electronic component cooling apparatus as defined in claim 15, wherein said side walls of said casing each are integrally provided on an inner surface of a portion thereof positioned between said two hooks with at least one projection in a manner to be projected inwardly therefrom in said width direction;

said projection being contacted with an outer surface of each of said side walls of said heat sink corresponding thereto when said heat sink and casing are combined with each other.

17. An electronic component cooling apparatus as defined in claim 16, wherein said side walls of said heat sink each are formed on an outer surface thereof in said width direction with a contact surface in a manner to face outwardly in said width direction and continuously extend in said longitudinal direction; and, said side walls of said casing each are provided at said portion thereof positioned between said hooks with at least one projection contacted with said contacted surface.

18. An electronic component cooling apparatus as defined in claim 15, wherein said side walls of said heat sink each are formed on an outer surface thereof in said width direction with a contact surface in a manner to face outwardly in said width direction and continuously extend in said longitudinal direction;

said side walls of said casing each are integrally provided on an inner surface of a portion thereof positioned between said two hooks with at least one projection in a manner to be projected inwardly therefrom in said width direction; and said side walls of said casing each are integrally provided at a portion thereof positioned between said projections with at least one projection contacted with said contacted surface.

19. An electronic component cooling apparatus as defined in claim 15, wherein said hooks of each of said side walls of said casing are positioned adjacently to said side wall-side extension sections, respectively.

20. An electronic component cooling apparatus as defined in claim 15, wherein said side wall-side extension sections of said side walls of said casing include enlargements extending from said opposite wall toward said heat sink, respectively;

said hooks and said enlargements of said extension sections of said side walls of said casing corresponding thereto being connected to each other through connections, respectively.

* * * * *

UNITED STATES PATENT AND TRADEMARK OFFICE
CERTIFICATE OF CORRECTION

PATENT NO. : 6,137,680
DATED : October 24, 2000
INVENTOR(S) : Kodaira et al.

It is certified that error appears in the above-identified patent and that said Letters Patent is hereby corrected as shown below:

Column 9, Line 47, delete "2Ca" and insert --21Ca--.

Column 15, Line 45, (Claim 14, Line 2), delete "claim 13" and insert --claim 12--.

Signed and Sealed this

Fifteenth Day of May, 2001

*Attest:*

NICHOLAS P. GODICI

*Attesting Officer*   Acting Director of the United States Patent and Trademark Office